United States Patent [19]
Mathias

[11] 4,023,113
[45] May 10, 1977

[54] VOLTAGE CONTROLLED FILTER

[75] Inventor: Robert G. Mathias, Brookfield, Ill.

[73] Assignee: Hammond Corporation, Chicago, Ill.

[22] Filed: July 28, 1975

[21] Appl. No.: 599,867

Related U.S. Application Data

[62] Division of Ser. No. 447,907, March 4, 1974, Pat. No. 3,906,830.

[52] U.S. Cl. .............................. 330/107; 330/35; 330/86
[51] Int. Cl.² ........................................ H03F 1/36
[58] Field of Search ............... 330/35, 86, 107; 331/135, 136, 137

[56] References Cited

UNITED STATES PATENTS 3,289,102  11/1966  Hayashi ..................... 331/137 X

FOREIGN PATENTS OR APPLICATIONS 620,949  5/1961  Canada ..................... 331/137 X

OTHER PUBLICATIONS

Altman – "Discrete Semiconductor Devices Proliferate and Prosper–Electronics," pp. 85–94, Apr. 26, 1973.

Primary Examiner—Rudolph V. Rolinec
Assistant Examiner—Lawrence J. Dahl
Attorney, Agent, or Firm—Neuman, Williams, Anderson & Olson

[57] ABSTRACT

A voltage controlled filter with a plurality of cascaded phase shift circuit stages in a negative feedback path of an amplifier. Each phase shift circuit stage is a RC phase shift network which includes a series capacitor and a field effect transistor (FET) with its source-drain circuit connected as a shunt to ground. The magnitude of the effective source-drain resistance of the FET in each stage is controlled by a DC control voltage which is applied in common to the gate of each FET.

2 Claims, 2 Drawing Figures

VOLTAGE CONTROLLED FILTER

This application is a division of application Ser. No. 447,907, filed Mar. 4, 1974, now U.S. Pat. No. 3,906,830, issued Sept. 23, 1975.

This invention relates to voltage controlled filters which are particularly useful in electronic music synthesizers of the monophonic or polyphonic type.

The prior art voltage controlled filters known to this Applicant have been comprised of very complex circuitry which performs well but is expensive to manufacture. The voltage controlled filter provided in accordance with this invention is of relatively simple construction in comparison with such prior art systems, yet performs satisfactorily to achieve substantially the same result.

A voltage controlled filter in accordance with this invention comprises an amplifier receiving an audio input signal with a plurality of harmonic components and having a plurality of cascaded phase shift circuit stages in a negative feedback path from output to input. Each of the cascaded phase shift stages comprises a series capacitor and a field effect transistor (FET) with its source-drain circuit connected between a terminal of said capacitor and ground reference. The gate electrode of the FET in each stage is connected in common to a control terminal such that the effective source-drain resistance of each FET is controlled by the magnitude of D.C. voltage on the control terminal. In this manner, the frequency response of all phase shift stages is simultaneously varied by a change in control voltage; and, accordingly, the overall frequency response characteristic of the filter circuit is shifted.

Other features of the invention are set forth in the detailed description of an embodiment of this invention shown in the drawings which are briefly described as follows:

FIG. 1 depicts a voltage-controlled filter which is of quite simple construction and performs quite adequately in comparison to much more complex voltage-controlled filters in prior art synthesizer systems. An audio signal containing multiple harmonic components is fed through the network of resistors R173 to R177 and capacitor C33 to the positive input of operational amplifier OA2.

Figure 1:
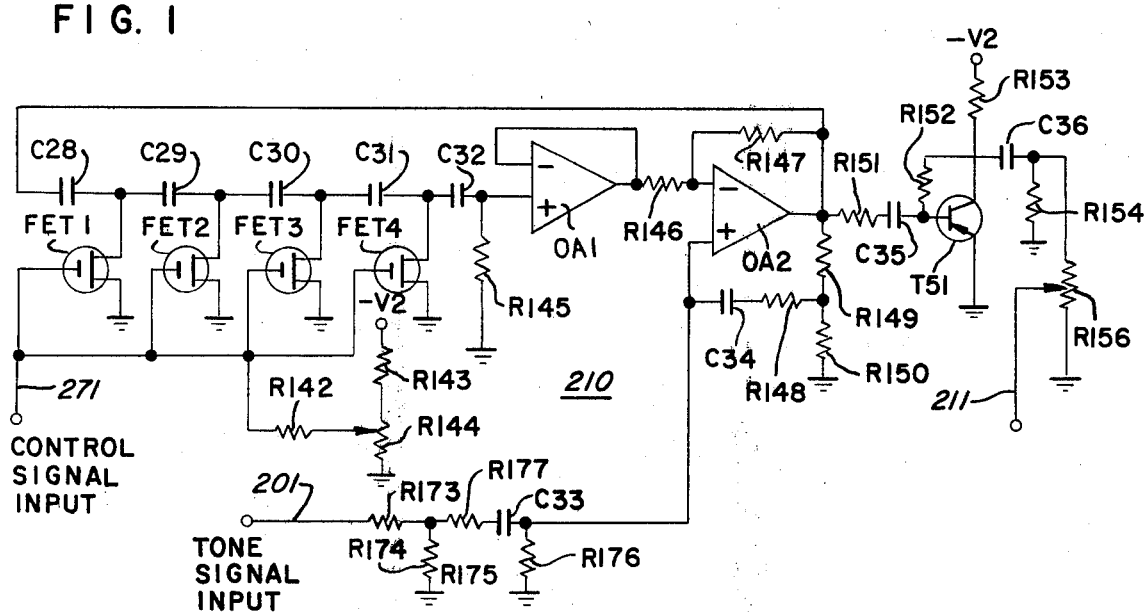
FIG. 1 is a circuit schematic diagram of a voltage controlled filter in accordance with this invention.
Figure 2:
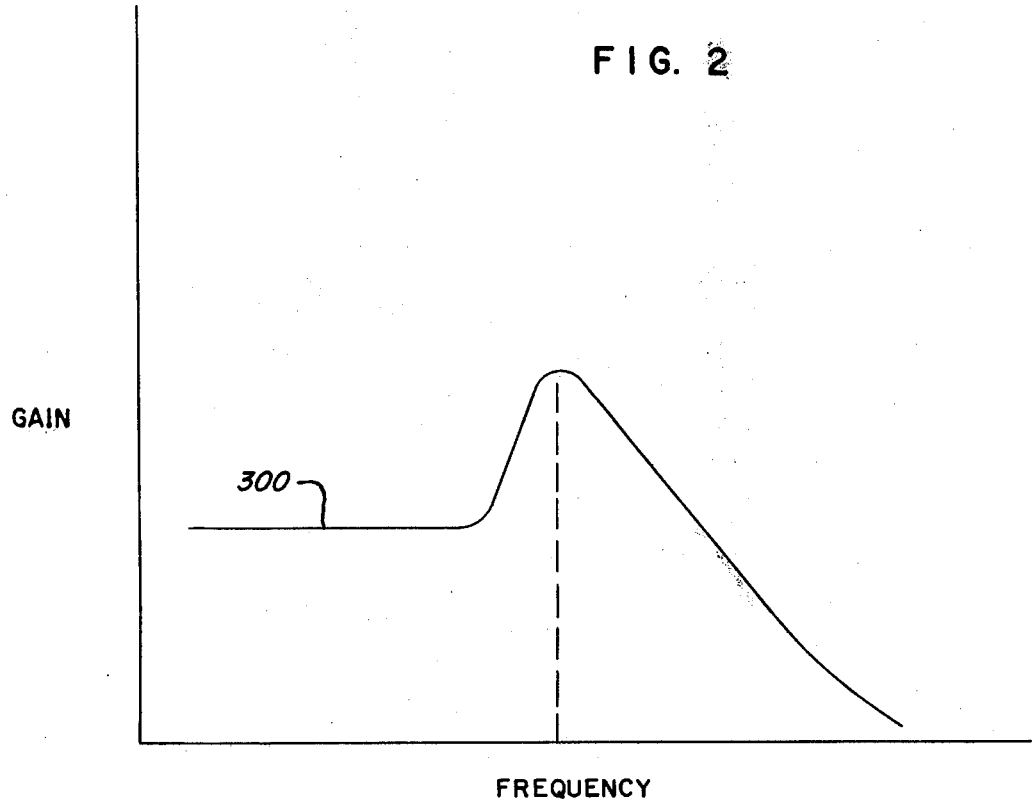
FIG. 2 is a graphical representation of the response curve of a voltage controlled filter of FIG. 1.

Capacitors C28 to C31 together with matched field effect transistors FET 1 through FET 4 comprise four cascaded RC phase shift networks in a negative feedback loop of operational amplifier OA2. The effective source-drain resistance of FET 1 to FET 4 is controlled by the voltage on a control signal input to each of their gate electrodes and alters the frequency response of each network. At some signal frequency depending upon the gate voltage, the four phase shift networks will produce a 180° phase shift in the signal transmitted therethrough. This frequency will be denoted the resonant frequency. Consequently, at the resonant frequency, the negative feedback becomes in phase with the positive feedback and this peaks the response of the filter at the resonant frequency as shown in FIG. 2. The effect of negative feedback via resistor R147 limits or stabilizes the gain of operational amplifier OA2 at the resonant frequency. Operational amplifier OA1 is operated in a unity gain mode and prevents the phase shift networks from loading the input to operational amplifier OA2. For signal frequencies substantially lower than the resonant frequency, the cascaded phase shift networks highly attenuate the signal so there is very little negative feedback for those frequencies. However, due to the effect of negative feedback via resistor R147 and positive feedback via resistors R148 and R149 and capacitor C34, a net positive gain occurs for low frequency signals to provide level frequency response of the filter at those frequencies as shown in FIG. 2. For signal frequencies substantially above the resonant frequency the cascaded phase shift networks possible progressively less phase shift or attenuation, and thus for those frequencies negative feedback progressively balances out positive feedback. Thus the response of the filter rapidly diminishes or drops toward zero above the resonant frequency as shown in FIG. 2.

Thus, by controlling the DC control signal envelope into the gates of FET 1 and through FET 4, the resonant frequency of the filter can be dynamically varied. Transistor T51 and its associated circuit components comprise an AC amplifier for the output signal from the voltage-controlled filter.

The above description is given by way of example only, and it should be apparent that numerous modifications could be made therein without departing from the scope of the invention as set forth in the claims below. In addition, the following table sets forth a set of component types and values employed in a working model of this invention, but the invention is not limited thereto, since many variations in circuitry and components are possible within the scope of the claimed invention.

| RESISTORS (ohms) | |
| --- | --- |
| 176 | 8.2K |
| 153 | 10K |
| 146 | 50K |
| 143, 144, 148, 149, 150, 151, 154, 156, 173, 174, 177 | 100K |
| 147 | 220K |
| 142 | 470K |
| 152 | 2.2M |
| 145 | 10M |
| CAPACITORS (Microfarads) | |
| 28, 29, 30, 31 | .0047 |
| 32 | .047 |
| 35, 36 | .056 |
| 33 | .56 |
| 34 | 10 |
| OPERATIONAL AMPLIFIERS | RCA CA 3741 |
| TRANSISTOR T51 | Sprague 32S 6438 |
| QUAD FET (FET 1 to FET 4) | National MM 552D |

I claim:
1. A voltage controlled filter comprising:
an amplifier having a first input terminal for receiving an audio signal with a plurality of harmonic components, a second input terminal for receiving feedback signals and an output terminal;
a first feedback circuit connected to said output terminal and said second input terminal for providing a first feedback signal;
a second feedback circuit having a preselected fixed impedance and connected to said output terminal and said second input terminal for providing a negative feedback signal;
said first feedback circuit including:

a plurality of voltage controlled phase shift networks cascaded in series; and, a control voltage input connected in common to each of said phase shift networks; each of said phase shift networks including:

a series capacitor of a preselected value; and, a field effect transistor having a sourcedrain circuit connected between a terminal of said capacitor and ground reference and a gate electrode connected to said control voltage input so that the effective sourcedrain resistance of said field effect transistor and the frequency response of said phase shift network are controlled by the magnitude of the voltage at said control input; said phase shift networks set at a selected frequency response determined by said voltage magnitude at said control input provide said first feedback signal shifted substantially 180° in phase and said second feedback circuit provides said negative feedback signal, said phase shifted first feedback signal and said negative feedback signal combine producing a peak frequency response of said filter for said audio input signal components at said selected frequency;

said phase shift networks substantially block said first feedback signal at a frequency lower than said selected frequency and said second feedback circuit provides said negative feedback signal for limiting the gain of said amplifier producing a level frequency response of said filter at said lower frequency; and said phase shift networks provide progressively more of said first feedback signal at a frequency higher than said selected frequency and said second feedback circuit provides said negative feedback signal, said first feedback signal and said negative feedback signal combine producing a rapidly diminishing frequency response of said filter at said higher frequency.

2. A voltage controlled filter as set forth in claim 1 further comprising:

a high imput impedance means connected between said first feedback circuit and said second input terminal for providing loading protection for said amplifier.

* * * * *